United States Patent
Lee et al.

(10) Patent No.: US 6,756,292 B2
(45) Date of Patent: Jun. 29, 2004

(54) METHOD OF FORMING A QUANTUM DOT AND A GATE ELECTRODE USING THE SAME

(75) Inventors: Jang-Eun Lee, Gyeonggi-do (KR); Sun-Hoo Park, Gyeonggi-do (KR); Jung-Hoon Son, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/243,956

(22) Filed: Sep. 16, 2002

(65) Prior Publication Data

US 2003/0092227 A1 May 15, 2003

(30) Foreign Application Priority Data

Sep. 21, 2001 (KR) ........................................ 2001-58748

(51) Int. Cl.[7] ............................................. H01L 21/477
(52) U.S. Cl. ....................... 438/591; 438/783; 438/786; 438/962
(58) Field of Search ................................ 438/257, 261, 438/263, 264, 585, 591, 592, 593, 594, 783, 786, 962

(56) References Cited

U.S. PATENT DOCUMENTS

| | | | | |
|---|---|---|---|---|
| 4,732,801 A | * | 3/1988 | Joshi ........................... | 428/198 |
| 5,420,746 A | * | 5/1995 | Smith ........................... | 361/311 |
| 6,054,349 A | * | 4/2000 | Nakajima et al. ............ | 438/257 |
| 6,060,743 A | | 5/2000 | Sugiyama et al. | |
| 6,090,666 A | | 7/2000 | Ueda et al. | |
| 6,118,686 A | | 9/2000 | Taira et al. | |
| 6,194,237 B1 | * | 2/2001 | Kim et al. ..................... | 438/22 |
| 6,281,100 B1 | * | 8/2001 | Yin et al. ..................... | 438/585 |
| 6,297,095 B1 | * | 10/2001 | Muralidhar et al. ......... | 438/257 |
| 6,339,025 B1 | * | 1/2002 | Liu et al. ..................... | 438/687 |
| 6,436,805 B1 | * | 8/2002 | Trivedi ........................ | 438/618 |
| 6,444,545 B1 | * | 9/2002 | Sadd et al. .................. | 438/503 |

\* cited by examiner

*Primary Examiner*—Carl Whitehead, Jr.
*Assistant Examiner*—Stephen W. Smoot
(74) *Attorney, Agent, or Firm*—Volentine Francos, PLLC

(57) ABSTRACT

In a method of forming a quantum dot having nanometeric size and a method of forming a gate electrode including the quantum dot, a first layer including a first material is deposited on the substrate. The first material has first atoms that are superbundant and bound with the weak bonding energy in the first layer. A second layer is deposited on the first layer. The second layer comprises a second material including second atoms that are capable of migrating into the first atoms. The first atoms are migrated into the second layer and the second atoms are migrated into the first layer, so that the second atoms are arranged in the first layer. Each of the second atoms in the first layer is formed into a quantum dot. An electrode layer is formed on the first layer after partially etching the second layer, and then a gate electrode is formed by patterning the electrode layer. Accordingly, The quantum dot can be formed in the semiconductor device in such a manner that a size and a distribution of the quantum dot is easily controlled.

23 Claims, 14 Drawing Sheets

METHOD OF FORMING A QUANTUM DOT AND A GATE ELECTRODE USING THE SAME

CROSS-REFERENCES TO RELATED APPLICATIONS

The present application claims priority from Korean Application No. 2001-0058748, filed Sep. 21, 2001, the entirety of which is hereby incorporated by reference for all purposes as if fully set forth herein.

BACKGROUND

1. Field of the Invention

The present invention relates to a method of forming a quantum dot and a gate electrode using the same. In particular, the present invention relates to a method of forming a quantum dot having nanometeric size and a method of forming a gate electrode comprising the quantum dot.

2. Description of the Related Art

Recently, information media, such as computers, are widely used, so that semiconductor technology makes great strides. In a functional aspect, a semiconductor device is required to be operated at a high speed with a large storage capacitance. Accordingly, the semiconductor technology is developed to improve the integration degree, the reliability, and the response speed of the semiconductor device.

In the semiconductor memory device, the integration level of a dynamic random access memory (DRAM) has been increased year by year. Now, a 64 gigabit DRAM cell having about a 70 nm design rule is expected to be manufactured by 2008, and a 1 terabit DRAM cell having about a 35 nm design rule is expected to be manufactured by 2014.

However, the conventional method of forming a layer, for example including an optical lithography technique and a chemical vapor deposition (CVD) technique, is not proper to manufacture the 64 gigabit DRAM cell or 1 terabit DRAM cell, so that research on an improved method of manufacturing the high density DRAM cell has been carried out intensively.

A new lithography technique using an electron beam (EB) or X-ray has been developed in substitute for the optical lithography technique, and an atomic layer deposition (ALD) technique has superseded the CVD technique. In addition, a semiconductor device is now feverishly under study, including a quantum dot of nanometric size which can be applicable to a single electron gate.

A semiconductor device including the quantum dot and a manufacturing method for the semiconductor device using the same are disclosed in U.S. Pat. No. 6,060,743 (issued to Sugiyama et al.), U.S. Pat. No. 6,090,666 (issued to Ueda et al.), and U.S. Pat. No. 6,118,686 (issued to Taira et al.).

The quantum dot has been mainly formed by the following methods.

The quantum dot can be formed using a focused ion beam (FIB), or the EB. The FIB or the EB can coercively put ions or atoms into a predetermined region of the semiconductor substrate, and advantageously, the FIB or the EB can easily control the size and the position of the quantum dot. However, the method of forming the quantum dot using the FIB or the EB has a low productivity, so that the method is not suitable for commercial applications.

The quantum dot can also be formed by forming nuclear atoms as disclosed in the U.S. Pat. No. 6,090,666. In detail, a non-crystalline layer having an amorphous substance is first formed, and then the non-crystalline layer is thermally processed to form a mono crystal. The method disclosed in the U.S. Pat. No. 6,090,666 forms the quantum dot by using the mono crystal. The method using the mono crystal has advantageously a high productivity, but the size and the distribution of the quantum dot is hard to control.

Accordingly, a new method is required to form the quantum dot in such a manner that the size and distribution of the quantum dot are easily controlled and the productivity of the quantum dot is high enough to have a good commercial use.

SUMMARY

The present invention has been made to solve the above problems of the related art, therefore, it is a first object of the present invention to provide a method for forming a quantum dot capable of easily controlling the size and the position of the quantum dot and having a high productivity.

A second object of the present invention is to provide a method for forming a gate electrode of the semiconductor device using the above method for forming the quantum dot.

In one aspect of the present invention, there is provided a method of forming a quantum dot comprising: i) depositing a first layer including a first material on a substrate, the first material having first atoms which are superabundantly present and bound with a weak bonding energy in the first layer; ii) depositing a second layer including a second material on the first layer, the second material having second atoms capable of migrating into the first layer; and iii) allowing the first atoms to migrate to the second layer, and the second atoms to migrate from the second layer to the first layer to arrange the second atoms in the first layer.

In detail, a quantum dot may be formed by: i) depositing a SiON (silicon oxide nitride) layer including Si atoms on a substrate, the Si atoms being superabundantly present therein and bound with a weak bonding energy in the SiON layer; ii) depositing a conductive layer including a conductive material on the SiON layer, the conductive material having reaction atoms capable of migrating into the SiON layer; and iii) performing a heat treatment to migrate the reaction atoms from the conductive layer into the SiON layer, whereby the reaction atoms are arranged in the SiON layer.

In another aspect of the present invention, there is provided a first method of forming a gate electrode in a semiconductor device comprising: i) defining a substrate into an active area and a field area; ii) depositing a gate oxide layer on the active area of the substrate; iii) depositing a SiON layer including Si atoms on the gate oxide layer, the Si atoms being superabundantly present therein and bound with weak bonding energy in the SiON layer; iv) depositing a conductive layer including a conductive material on the SiON layer, the conductive material having reaction atoms capable of migrating into the SiON layer; v) performing a heat treatment to allow the reaction atoms to migrate from the conductive layer to the SiON layer, whereby the reaction atoms are arranged in the SiON layer to form the reaction atoms into a quantum dot; vi) removing the conductive layer to expose a surface of the SiON layer; vii) depositing an electrode layer including a gate electrode material on the SiON layer; and viii) sequentially etching the electrode layer and the SiON layer of a predetermined region to expose a surface of the gate oxide layer.

In yet another aspect of the present invention, there is provided a second method for forming a gate electrode in a semiconductor device comprising: i) defining a substrate into an active area and a field area; ii) depositing a gate oxide layer on the active area of the substrate; iii) depositing a SiON layer including Si atoms on the gate oxide layer, the Si atoms being superabundantly present therein and bound with weak bonding energy in the SiON layer; iv) etching the SiON layer of a predetermined region to form a SiON pattern layer partially exposing a surface of the gate oxide layer; v) successively depositing a conductive layer including a conductive material on the SiON pattern layer and the gate oxide layer, the conductive material having reaction atoms capable of migrating into the SiON layer; vi) performing a heat treatment to allow the reactant atoms to migrate from the conductive layer to the SiON layer, whereby the reaction atoms are arranged in the SiON layer to form the reaction atoms into a quantum dot; vii) removing the conductive layer to expose a surface of the SiON pattern layer and the gate oxide layer; and viii) depositing an electrode layer including a gate electrode material on the SiON pattern layer.

In still another aspect of the present invention, there is provided a third method for forming a gate electrode in a semiconductor device comprising: i) defining a substrate into an active area and a field area; ii) depositing a gate oxide layer on the active area of the substrate; iii) depositing a SiON layer including Si atoms on the gate oxide layer, the Si atoms being superabundantly present therein and bound with weak bonding energy in the SiON layer; iv) depositing a conductive layer including a conductive material on the SiON layer, the conductive material having reaction atoms capable of migrating into the SiON layer; v) performing a heat treatment to migrate the reaction atoms from the conductive layer to the SiON layer, whereby the reaction atoms are arranged in the SiON layer to form the reaction atoms into a quantum dot; and vi) sequentially etching the SiON layer and the conductive layer of a predetermined region to expose a surface of the gate oxide layer.

Accordingly, the quantum dot can be easily formed with a uniform distribution and size and with high productivity enough to be sufficient for commercial application. The method of forming the quantum dot can also applied for forming a gate electrode of the semiconductor device.

BRIEF DESCRIPTION OF THE DRAWINGS

The above objects and other advantages of the present invention will become more apparent by describing in detail preferred embodiments thereof with reference to the attached drawings, in which.

DETAILED DESCRIPTION

Hereinafter, the present invention will be described in detail with reference to accompanying drawings.

A first layer is deposited on a substrate. The first layer includes a first material that has first atoms. The first atoms are superabundantly present in the first layer and bound with weak bonding energy (or bonding force). The weak bonding energy refers to the bonding energy between atoms that is relatively weaker than that of other atoms in the first material. As a preferred embodiment of the present invention, the first atoms are preferably Si, and the first material is preferably an insulation material comprised of an oxide, a nitride, or a mixture thereof. The first layer is preferably formed by plasma enhanced chemical vapor deposition (hereinafter, referred to as PECVD) technique. Therefore, the first layer is preferably an insulation layer deposited by the PECVD. As a preferred embodiment of the present invention, the insulation layer can be a SiON layer comprising the Si atoms. The SiON layer can be formed by the PECVD using a mixture of a $NH_3$ gas, a $N_2O$ gas and a $SiH_4$ gas. In that case, a flow rate amount ratio of the $NH_3$ gas, the $N_2O$ gas and the $SiH_4$ gas is beneficially about 1:0.1–3.3:0.1–1.3. Furthermore, when the first layer is deposited by PECVD, a power of about 90–110 Watts is supplied to a chamber (a conventional chamber) for carrying out the PECVD to generate plasma.

Figure 1:
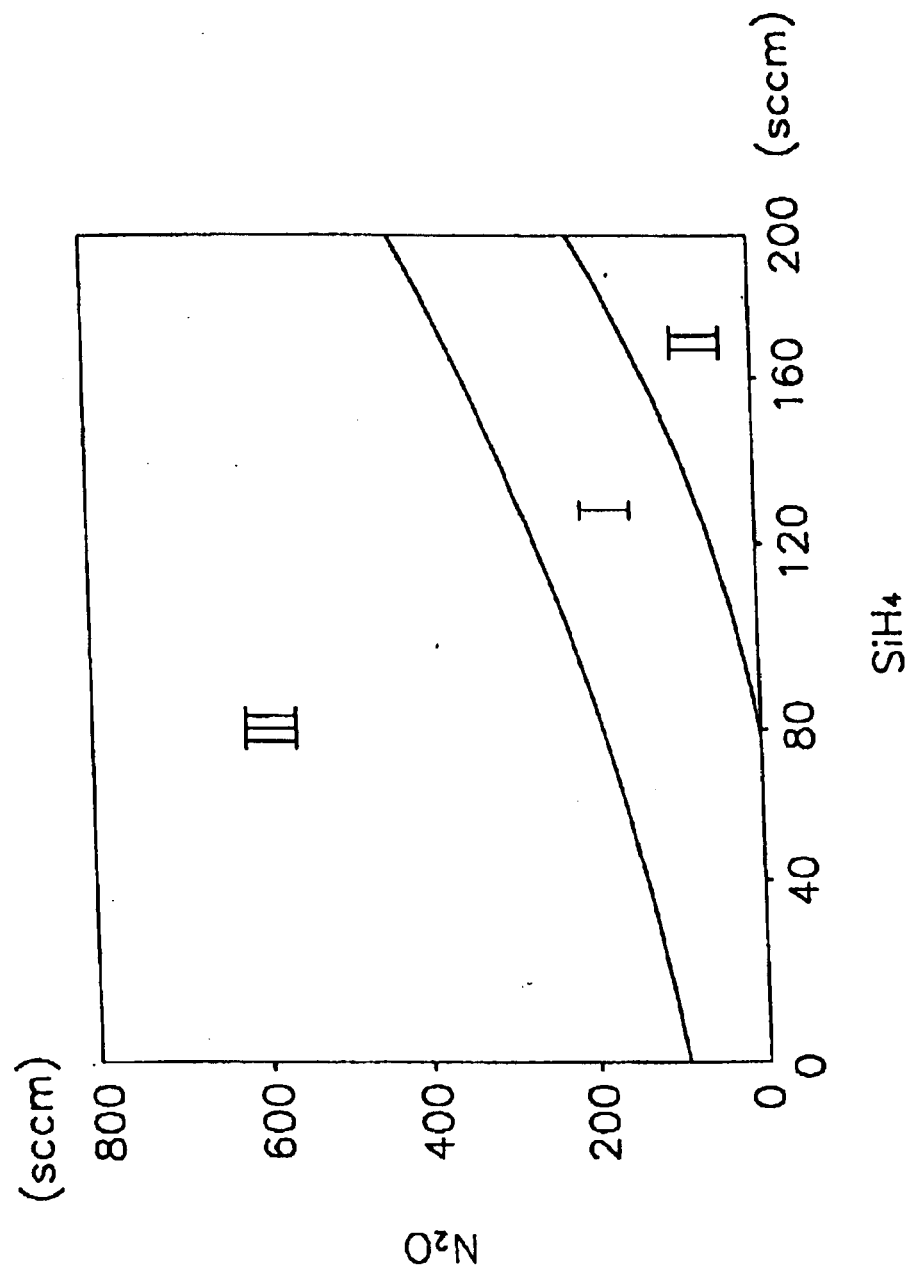
FIG. 1 is a graph showing a gas condition during a deposition of a first layer according to one embodiment.

FIG. 1 is a graph showing a gas condition during a deposition of the SiON layer when a flow rate for the $NH_3$ gas is about 150 sccm (standard cubic centimeters per minute) and a power of 100 Watts is applied to the chamber for generating the plasma. In the graph as shown in FIG. 1, a first line indicates the flow rate for the $N_2O$ gas in sccm, and a second line perpendicular to the first line indicates the flow rate for the $SiH_4$ gas in sccm. A first quadrant of the graph is divided in three domains, referred to as I, II, and III according to a condition of the flow rate of the $N_2O$ gas and the $SiH_4$ gas.

Referring to FIG. 1, in case that the $N_2O$ gas and the $SiH_4$ gas is supplied in a condition of the I-domain, the SiON layer is formed to have a structure that the Si atoms are superabundantly present in the SiON layer and bound with the weak bonding energy. When the $N_2O$ gas and the $SiH_4$ gas is supplied in a condition of the II-domain, the SiON layer is formed to have a structure that the Si atoms are more superabundant in the SiON layer as compared with the I-domain condition and bound with the weak bonding energy lower than that of the I-domain condition. Namely, decreasing the flow rate of the $N_2O$ gas and increasing the flow rate of the $SiH_4$ gas from any supply condition of the I-domain can make a well-reactive SiON layer of the II-domain. However, when the $N_2O$ gas and the $SiH_4$ gas are supplied in a condition of the III-domain, the SiON layer is formed to have a structure that the Si atoms are not reactive.

A second layer is deposited on the first layer. The second layer comprises a second material having second atoms that are capable of migrating into the first layer. As a preferred embodiment of the present invention, the second atoms can be Al, Cu, Au, Pt, Cr, Ru or Ta, and the second material can be a conductive material which is comprised of at least any one selected from the group consisting of a compound containing Si material (hereinafter, referred to as Si-compound), a compound containing Ge material (hereinafter, referred to as Ge-compound), Al, Cu, Au, Pt, Cr, Ru and Ta. Preferably, the second layer is deposited by means of sputtering or a chemical vapor deposition (CVD) technique. Therefore, the second layer is a conductive layer formed by the sputtering or the CVD technique. As one embodiment of the conductive layer, the conductive layer can be an Al layer or a composite layer including 99% Al and 1% Si, so that the conductive layer can comprise the Al atoms.

The first atoms in the first layer and the second atoms in the second layer are migrated into each other. In detail, the first atoms in the first layer are migrated from the first layer into the second layer, and the second atoms in the second layer are migrated from the second layer into the first layer. Accordingly, the second atoms are uniformly arranged in the first layer, so that each of the second atoms in the first layer is formed into a quantum dot. At that time, the migration of the atoms is carried out by heat treatment that is controlled by time and temperature. Due to the heat treatment, the first atoms, which are superabundant and bound with the weak bonding energy in the first layer, can migrate into the second layer while the first atoms are reacted with the second atoms of the second layer. Each of the second atoms that are migrated into the first layer is formed into a mono-crystalline quantum dot. At that time, the quantum dot has a diameter of 70 nm or less, so that the above-described method of forming the quantum dot can be applicable to manufacturing the 64-gigabit or 1 terabit DRAM.

Hereinafter, an embodiment of a method for forming the quantum dot will be described in detail with reference to accompanying drawings.

Embodiment 1

Figure 2A:
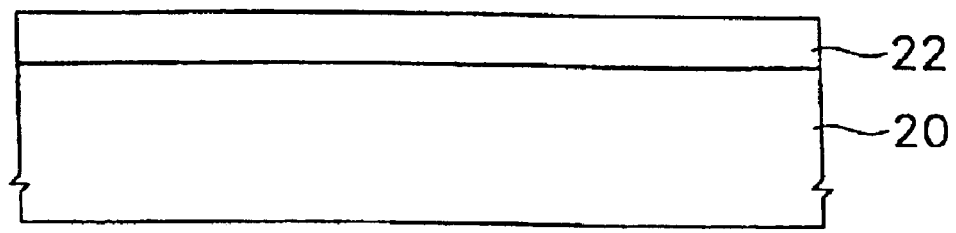
FIGS. 2A to 2D are sectional views illustrating a method of forming a quantum dot according to a first embodiment.

Referring to FIG. 2A, a SiON layer 22 is deposited on a substrate 20 by carrying out the PECVD with an $NH_3$ gas, an $N_2O$ gas and a $SiH_4$ gas. At that time, the $N_2O$ gas is supplied into a PECVD chamber at a rate of 50 sccm, the $SiH_4$ gas is supplied at a rate of 200 sccm, and the $NH_3$ gas is supplied at a rate of about 150 sccm. Also, a power of about 100 Watts is supplied to the PECVD chamber for generating plasma. Thus, the SiON layer 22 is deposited on the substrate 20 to have such a structure that Si atoms are superabundantly present therein and bound with the weak bonding energy between Si atoms and O atoms. The SiON layer 22 is formed to have a thickness greater than a diameter of a quantum dot that is formed afterwards.

Figure 2B:
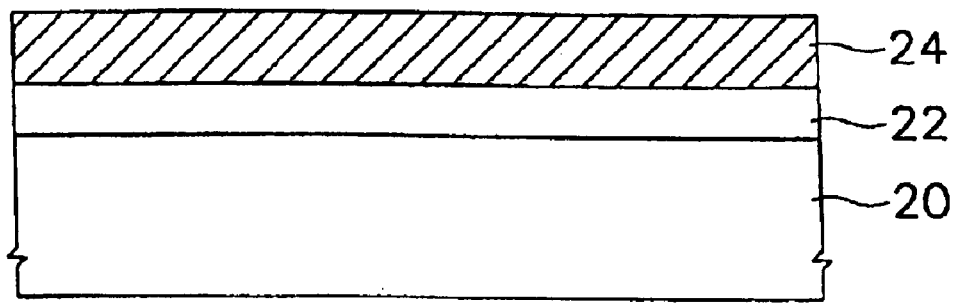

Referring to FIG. 2B, as a conductive layer, an Al layer 24 is deposited on the SiON layer 22. Preferably, the Al layer 24 is deposited by the sputtering technique with an Al material as a target of the sputtering.

Figure 2C:
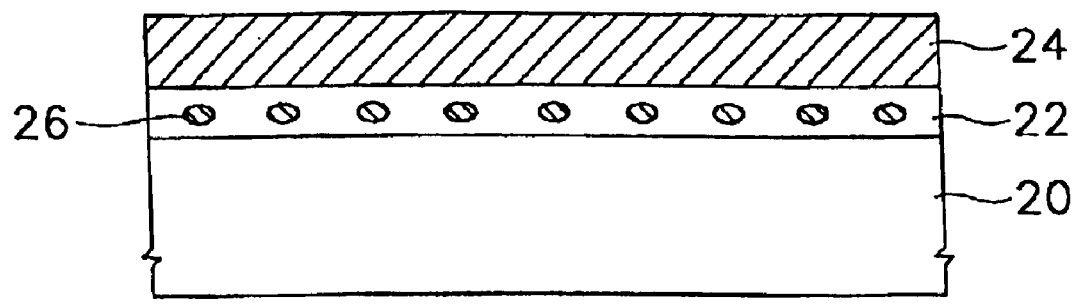

Referring to FIG. 2C, the Si atoms in the SiON layer 22 are migrated into the Al layer 24, and the Al atoms in the Al layer 24 are migrated into the SiON layer 22 by heat treatment. Preferably, the heat treatment is carried out for 60 seconds at a temperature of about 400° C. Consequently, the Al atoms are arranged in the SiON layer 22 and each of the Al atoms in the SiON layer 22 is formed into the quantum dot 26.

Figure 2D:
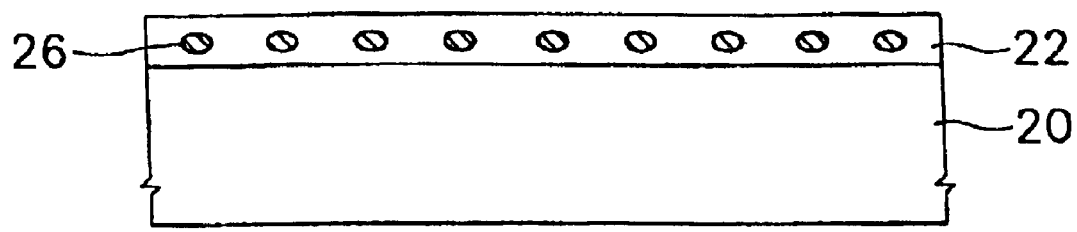

Referring to FIG. 2D, the Al layer 24 is etched out to expose a surface of the SiON layer 22 having the quantum dot 26. At that time, the Al layer 24 is etched by means of a wet etching or a dry etching method. Beneficially, the wet etching method uses a mixed solution including $H_3PO_4$, $NHNO_3$, $CH_3COOH$ and $H_2O$, and the dry etching method uses a $Cl_x$ gas for etching the Al layer 24. Therefore, according to the first embodiment, the SiON layer 24 including the quantum dot 26 of Al atom can be easily formed.

Practical measuring the diameter of the quantum dot, which is formed according to the first embodiment, confirms that the diameter of the quantum dot is about 20 nm. The measurement was carried out by a transmission electron microscope (TEM).

Embodiment 2

Figure 3A:
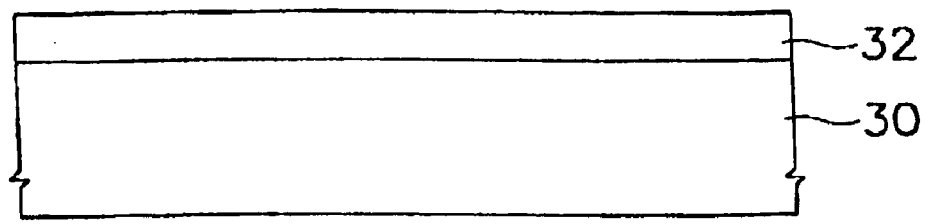
FIGS. 3A to 3E are sectional views illustrating a method of forming a quantum dot according to a second embodiment.

Referring to FIG. 3A, a SiON layer 32 is deposited on a substrate 30 by the same method as described in the first embodiment. The SiON layer 32 is deposited on the substrate 30 to have such a structure that Si atoms are superabundantly present therein and bound with the weak bonding energy between Si atom and O atom. The SiON layer 32 is formed to have a thickness greater than a diameter of a quantum dot that is formed afterwards.

Figure 3B:
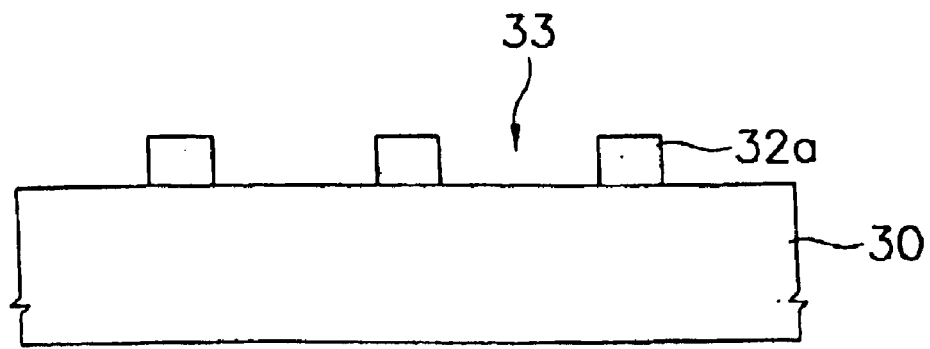

Referring to FIG. 3B, the SiON layer 32 is partially etched out to form a window portion 33 partially exposing a surface of the substrate 30 and to form a SiON pattern layer 32a. The etching of the SiON layer 32 can be performed by a conventional optical lithography, which uses a photoresist pattern as an etching mask, an improved E-beam lithography, or an improved X-ray lithography.

Figure 3C:
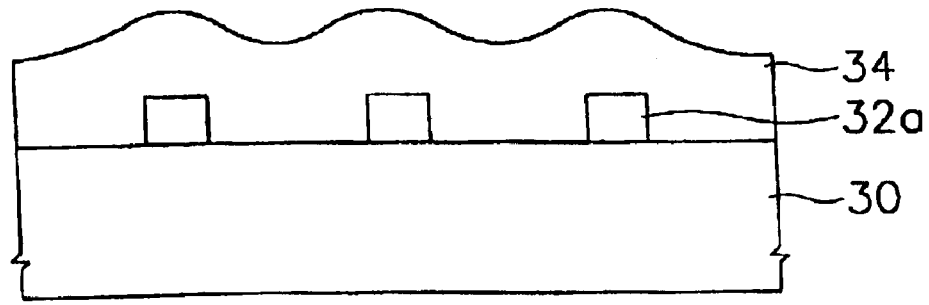

Referring to FIG. 3C, an Al layer 34 having Al atoms is formed as a conductive layer. The Al layer 34 is successively deposited on the SiON pattern layer 32a and the window portion 33 by the same technique as mentioned in the first embodiment.

Figure 3D:
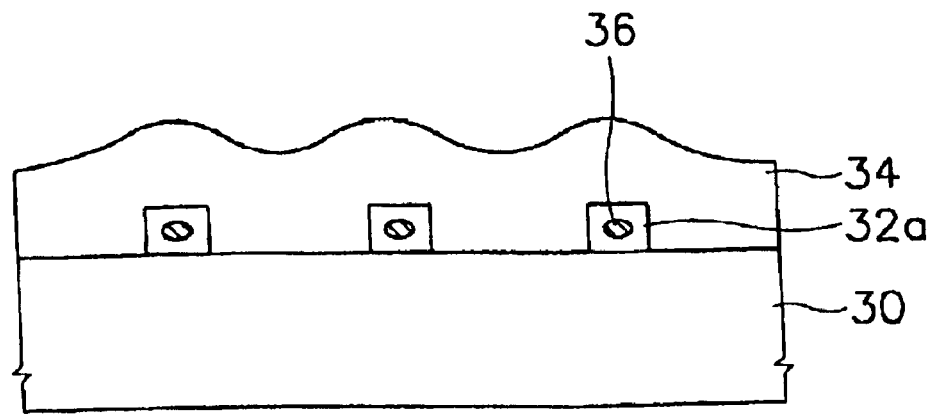

Referring to FIG. 3D, the Si atoms in the SiON pattern layer 32a migrate into the Al layer 34, and the Al atoms in the Al layer 34 migrate into the SiON pattern layer 32a by the same heat treatment as described in the first embodiment. Consequently, the Al atoms are arranged in the SiON pattern layer 32a and each of the Al atoms in the SiON pattern layer 32a is formed into the quantum dot 36.

Figure 3E:
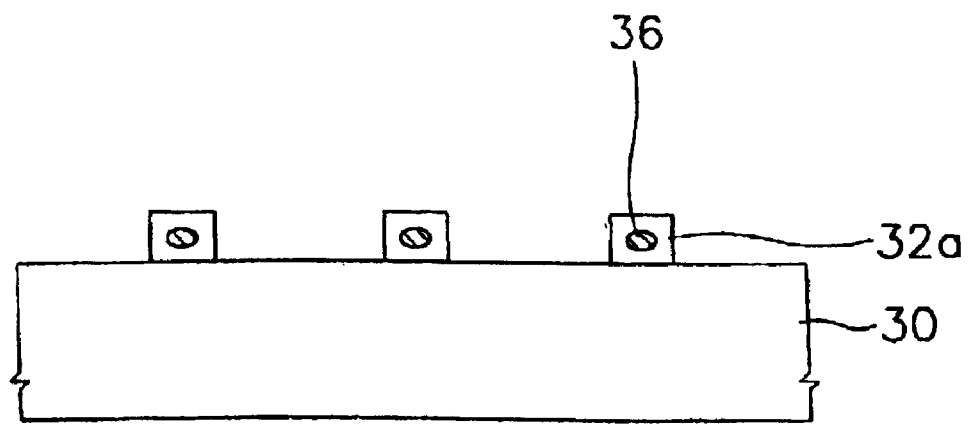

Referring to FIG. 3E, the Al layer 34 is etched out by the same etching method as described in the first embodiment. Accordingly, the quantum dot 36 can be easily formed in the SiON pattern layer 32a.

According to the second embodiment, the quantum dot of Al atom can be easily formed in the SiON pattern layer 32a.

Embodiment 3

Figure 4A:
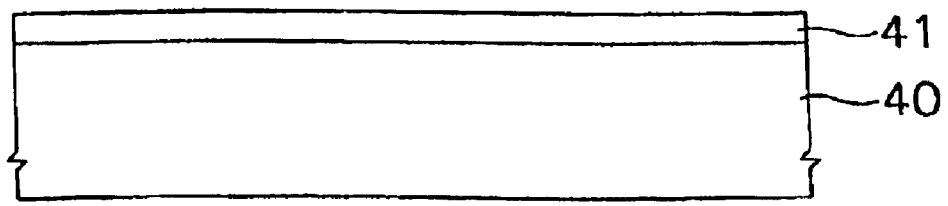
FIGS. 4A to 4F are sectional views illustrating a method of forming a quantum dot according to a third embodiment.

Referring to FIG. 4A, a silicon oxide layer 41 is deposited on a substrate 40 by a conventional deposition method.

Figure 4B:
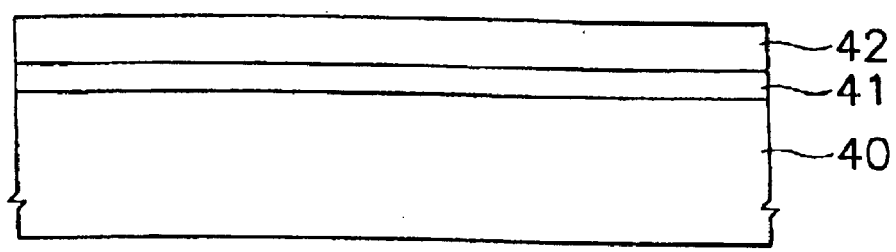

Referring to FIG. 4B, a SiON layer 42 is deposited on the silicon oxide layer 41 by the same deposition method as described in the first embodiment. Therefore, the SiON layer 42 is deposited on the substrate 40 to have such a structure that Si atoms are superabundantly present therein and bound with the weak bonding energy between Si atom and O atom. The SiON layer 42 is formed to have a thickness greater than a diameter of a quantum dot that is formed afterwards.

Figure 4C:
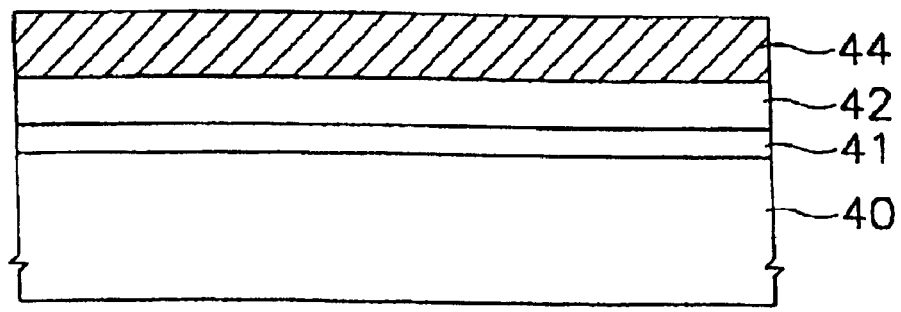

Referring to FIG. 4C, an Al layer 44 having Al atoms is formed as a conductive layer. The Al layer 44 is deposited by the same technique as mentioned in the first embodiment.

Figure 4D:
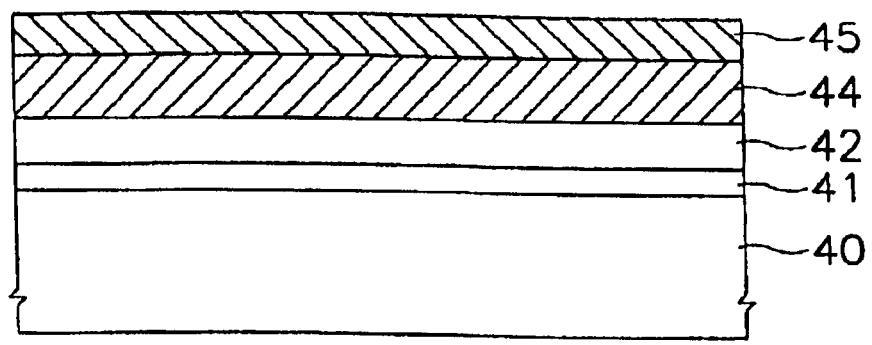

Referring to FIG. 4D, an anti-agglomerative layer 45 is deposited on the Al layer 44. Since the Al layer 44 is formed to be thin, the Al layer 44 tends to be partially agglomerated. Therefore, the anti-agglomerative layer 45 prevents the Al layer 44 from agglomerating during the following heat treatment. The anti-agglomerative layer 45 needs to be formed of material that does not react with a conductive material. Accordingly, the anti-agglomerative layer 45 deposited on the Al layer 44 is preferably formed of TaN.

Figure 4E:
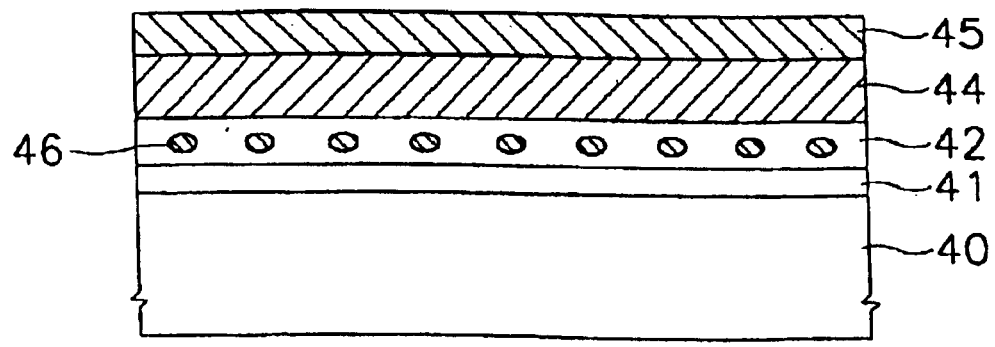

Referring to FIG. 4E, the Si atoms in the SiON layer 42 migrate into the Al layer 44, and the Al atoms in the Al layer 44 migrate into the SiON layer 42 by the same heat treatment as described in the first embodiment. Consequently, the Al atoms are arranged in the SiON layer 42 and each of the Al atoms in the SiON layer 42 is formed into the quantum dot 46.

Figure 4F:
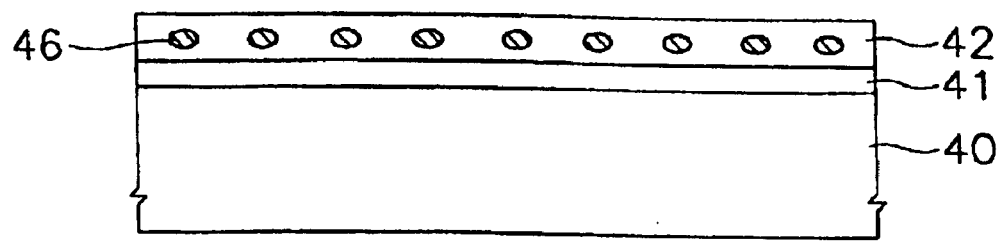

Referring to FIG. 4F, the anti-agglomerative layer 45 and the Al layer 44 are sequentially etched to expose a surface of the SiON layer 42. Accordingly, the SiON layer 42 having the quantum dot 46 can be easily formed. Namely, the quantum of Al atom can be easily formed in the SiON layer 42.

Furthermore, the SiON layer 42 having the quantum dot 46 is partially etched to form a SiON pattern layer including a window portion partially exposing a surface of the silicon oxide layer. Accordingly, the quantum of Al atom can be easily formed into the SiON pattern layer.

The SiON pattern layer including the quantum dot can replace a polysilicon layer of a gate electrode. For this reason, the above-described method of forming the quantum dot can be applied to fabricating a nanometric device such as a 1 terabit DRAM. Since physical phenomena of the nanometric device can be explained by quantum mechanics theory, and the conventional polysilicon layer of the gate electrode is based on the classical mechanics theory, the polysilicon layer is not suitable for the gate electrode of the nanometric device. Therefore, the method of forming the quantum dot is strongly required to be applied to the nanometric device.

A method for forming a gate electrode having the quantum dot will be described as follows.

Embodiment 4

Figure 5A:
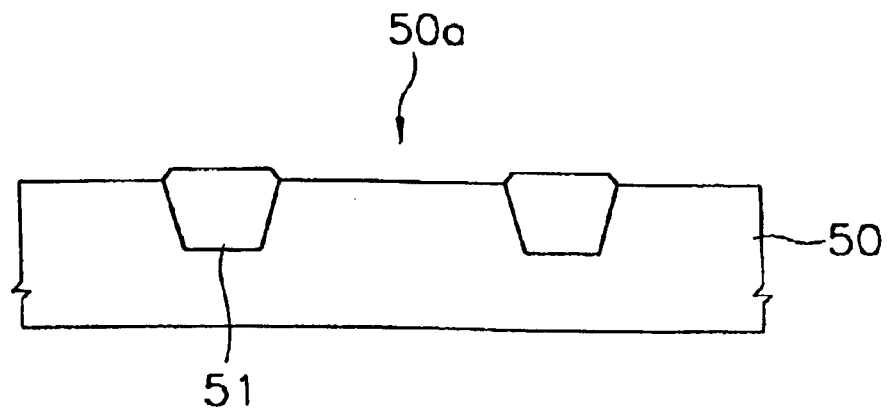
FIGS. 5A to 5H are sectional views illustrating a method of forming a gate electrode according to a fourth embodiment.

Referring to FIG. 5A, a substrate 50 is defined into an active area 50a and a field area 51. The field area 51 is defined by trench isolation. Otherwise, the field area 51 can be defined by field oxide structures.

Figure 5B:
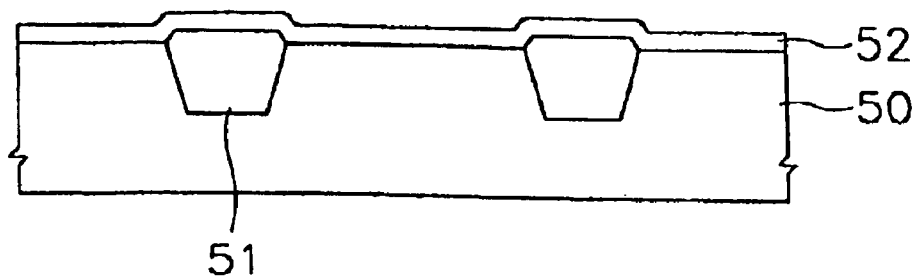

Referring to FIG. 5B, a gate oxide layer 52 is successively deposited on the field area 51 and the active area 50a. The gate oxide layer 52 is mainly comprised of a silicon oxide layer.

Figure 5C:
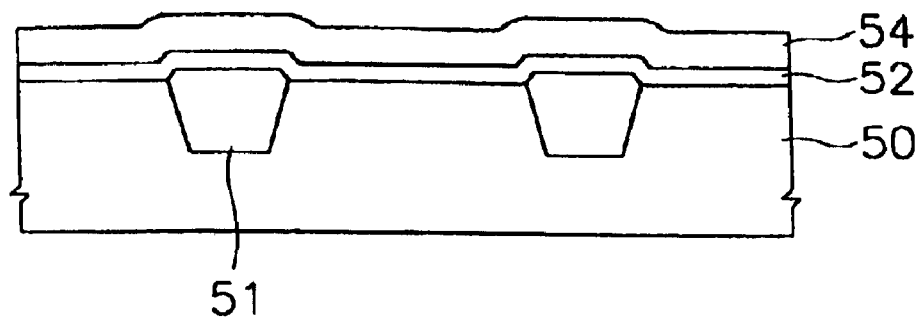

Referring to FIG. 5C, an SiON layer 54 is deposited on the gate oxide layer 52 by the same method as described in the first embodiment. Therefore, the SiON layer 54 is deposited on the substrate 50 to have such a structure that Si atoms are superabundantly present and bound with the weak bonding energy between Si atom and O atom. The SiON layer 54 is formed to have a thickness greater than a diameter of a quantum dot that is formed afterwards.

Figure 5D:
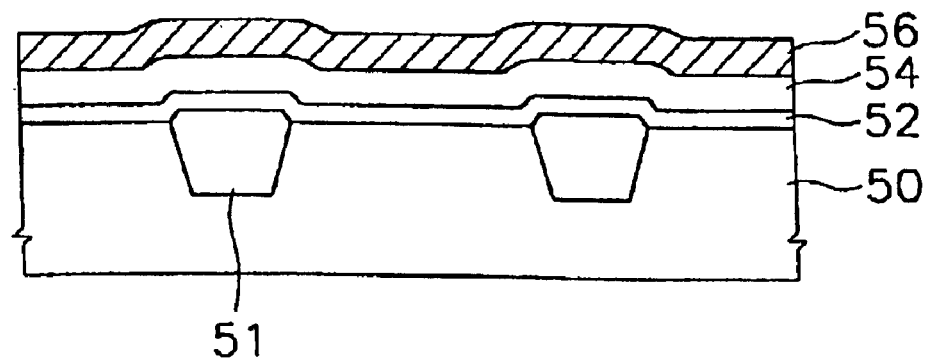

Referring to FIG. 5D, an Al layer 56 is deposited on the SiON layer 54 as a conductive layer. The Al layer 56 is deposited by the same technique as mentioned in the first embodiment. Furthermore, an anti-agglomerative layer (not shown) can be additionally deposited on the Al layer 56 for preventing the Al layer 56 from agglomerating during the following heat treatment. The anti-agglomerative layer (not shown) deposited on the Al layer 56 is preferably formed of TaN.

Figure 5E:
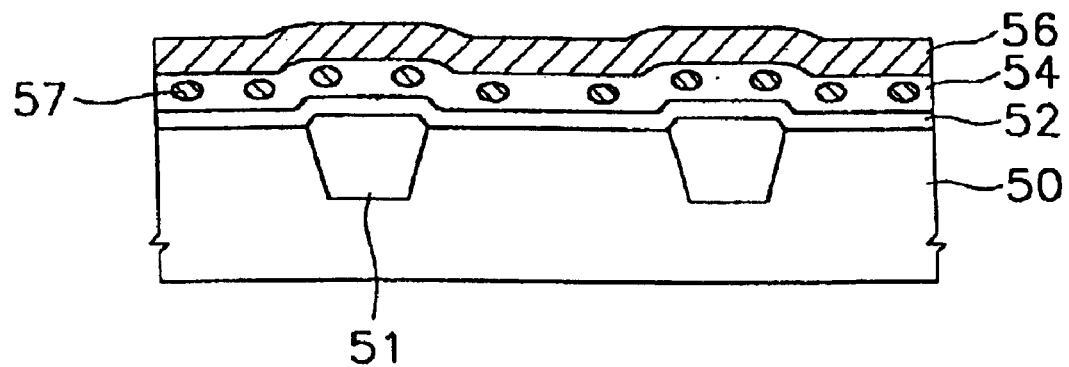

Referring to FIG. 5E, the Si atoms in the SiON layer 54 migrate into the Al layer 56, and the Al atoms in the Al layer 56 migrate into the SiON layer 54 by the same heat treatment as described in the first embodiment. Consequently, the Al atoms are arranged in the SiON layer 54 and each of the Al atoms in the SiON layer 54 is formed into the quantum dot 57.

Figure 5F:
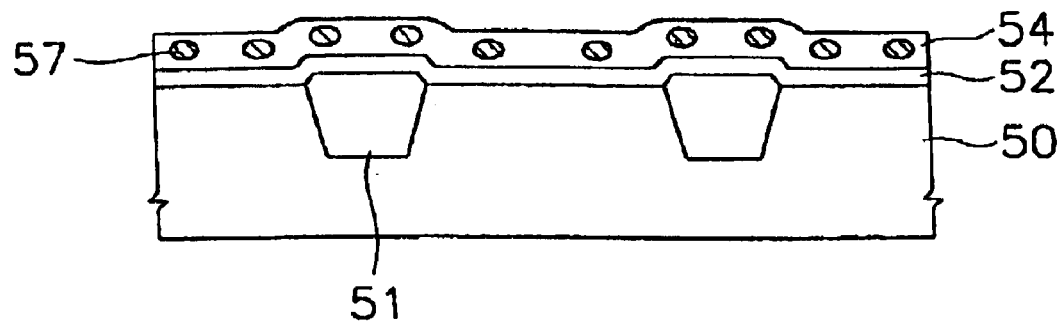

Referring to FIG. 5F, the Al layer 56 is partially etched out by the same method as described in the first embodiment, so that a surface of the SiON layer 54 including the quantum dot is partially exposed. If the anti-agglomerative layer is formed on the Al layer 56, the anti-agglomerative layer and the Al layer 56 are sequentially etched.

Figure 5G:
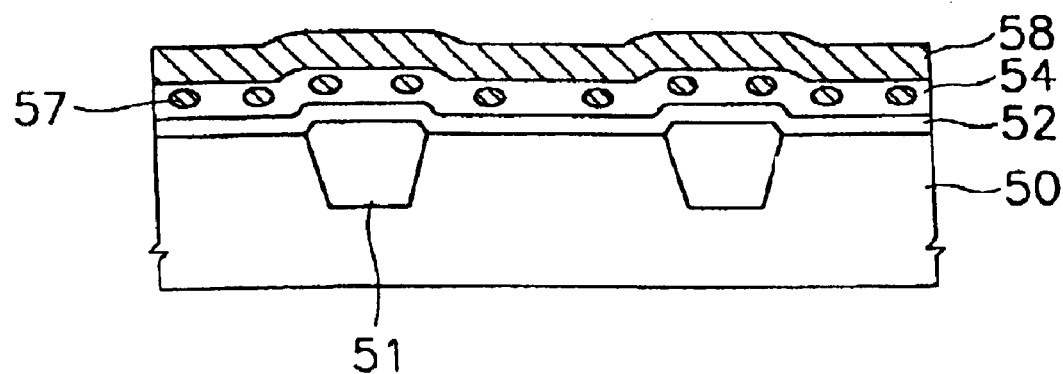

Referring to FIG. 5G, a gate electrode layer 58 is deposited on the SiON layer 54 including the quantum dot 57. The gate electrode 58 comprises gate electrode material such as WSi (tungsten silicide).

Figure 5H:
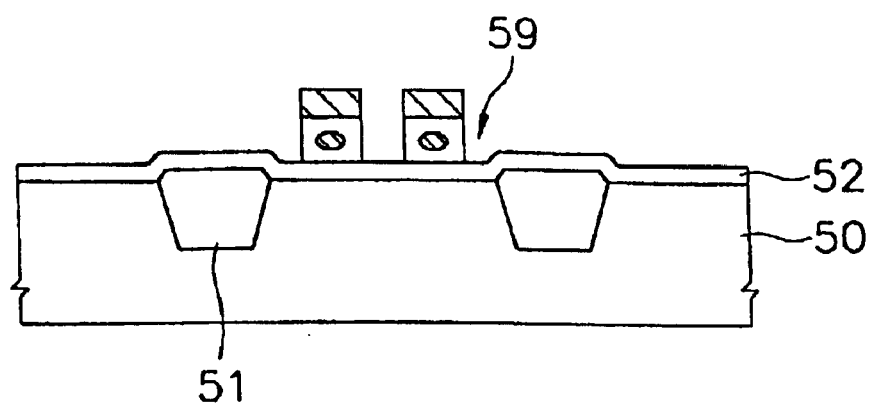

Referring to FIG. 5H, the gate electrode layer 58 and the SiON layer 54 including the quantum dot 57 are sequentially etched out to partially expose a surface of the gate oxide layer 52 to thereby form a gate electrode 59.

Accordingly, the SiON layer having the quantum dot can be applied to the gate electrode. Furthermore, a transistor of a semiconductor device is completed to form a source and a drain electrode on a bottom surface the substrate 50.

Otherwise, the SiON layer can be etched out after forming the SiON layer, so that a gate electrode pattern can be formed. At that time, the quantum dot of the Al atoms is formed in the SiON pattern layer, and the gate electrode layer is formed on the SiON pattern layer.

Embodiment 5

Figure 6A:
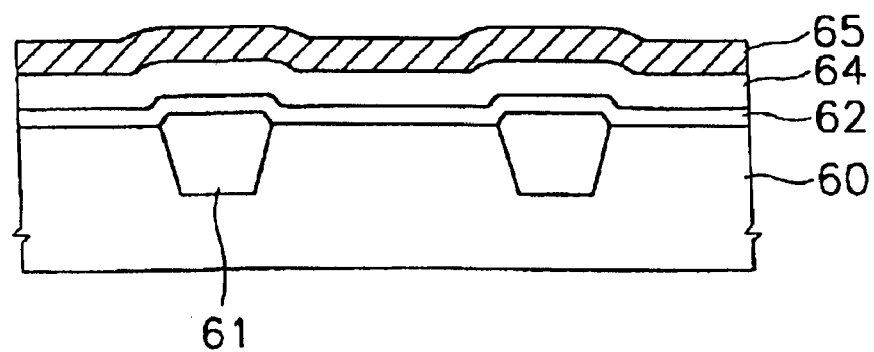
FIGS. 6A to 6C are sectional views illustrating a method of forming a gate electrode according to a fifth embodiment.

Referring to FIG. 6A, a substrate 60 is defined into an active area and a field area. The field area is defined by trench isolation 61, or can be defined by field oxide structures. A gate oxide layer 62 is successively formed on the field area and the active area of the substrate 60. The gate oxide layer 62 is mainly comprised of a silicon oxide layer. Subsequently, a SiON layer 64 is deposited on the gate oxide layer 62 by the same method as described in the first embodiment. Therefore, the SiON layer 64 is deposited on the substrate 60 to have such a structure that Si atoms are superabundant and bound with the weak bonding energy between Si atom and O atom. The SiON layer 64 is formed to have a thickness greater than a diameter of a quantum dot that is formed afterwards. Then, a conductive layer 65 comprising a gate electrode material is deposited on the SiON layer 64. The gate electrode material is preferably tungsten silicide (Wsi).

Figure 6B:
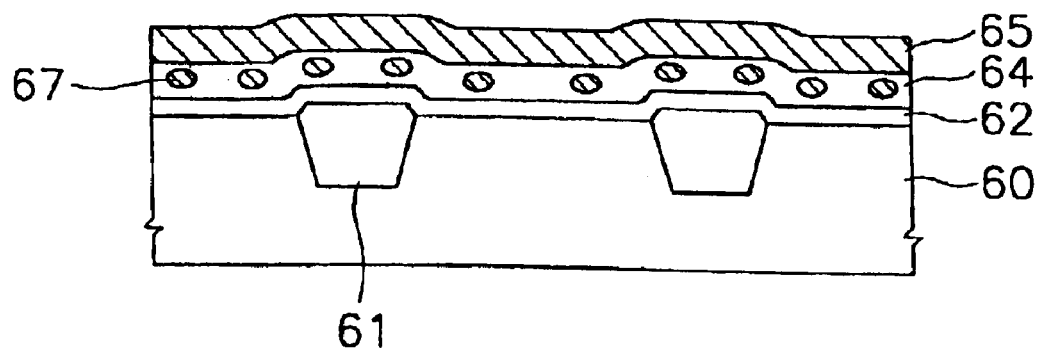

Referring to FIG. 6B, the Si atoms in the SiON layer 64 and reactive atoms in the conductive layer 65 migrate into corresponding layers. Namely, when the conductive layer 65 is formed with the tungsten silicide (Wsi), tungsten (W) atoms migrate into the SiON layer 64 and the Si atoms migrate into the conductive layer 65. Therefore, the quantum dot 67 of W atom is formed in the SiON layer 64.

Figure 6C:
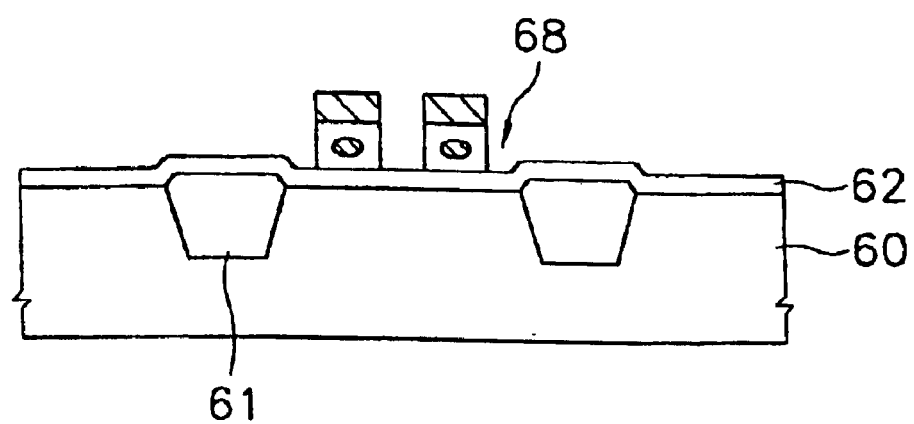

Referring to FIG. 6C, the conductive layer 65 and the SiON layer 64 including the quantum dot 67 are sequentially etched out, so that a surface of the gate oxide layer 62 is partially exposed to thereby complete a gate electrode 68.

According to the fifth embodiment of the present invention, the conductive layer 65 can be used as an electrode layer of the gate electrode 68. In particular, when the conductive layer is formed with the WSi, the conductive layer is more easily used as an electrode layer.

According to preferred embodiments of the present invention, the quantum dot can be easily formed with a diameter of 70 nm or less. The quantum dot can also be formed with uniform distribution since the technique of atomic migration is applied. Accordingly, the above-mentioned method of forming the quantum dot can be widely applied to fabricating the nanometric device since the size and distribution of the quantum dot can be easily controlled.

While the present invention has been described in detail with reference to the preferred embodiments thereof, it should be understood to those skilled in the art that various changes, substitutions and alterations can be made hereto without departing from the scope of the invention as defined by the appended claims.

What is claimed is:

1. A method of forming a quantum dot, comprising:
   i) depositing a first layer including a first material on a substrate, the first material having first atoms which are superabundantly present therein and are bound with a weak bonding energy in the first layer;
   ii) depositing a second layer including a second material on the first layer, the second material having second atoms capable of migrating into the first layer; and
   iii) allowing the first atoms to migrate to the second layer and the second atoms to migrate from the second layer to the first layer to arrange the second atoms in the first layer to form a quantum dot.

2. The method as claimed in claim 1, further comprising removing the second layer to expose a surface of the first layer.

3. The method as claimed in claim 1, wherein the first atoms are Si atoms, and the first material is an insulation material.

4. The method as claimed in claim 3, wherein the insulation material is an oxide, a nitride, or a mixture thereof.

5. The method as claimed in claim 1, herein the second atoms are Al (aluminum), Cu (copper), Au (gold), Pt (platinum), Cr (chromium), Ru (ruthenium), or Ta (tantalum), and the second material is a conductive material.

6. The method as claimed in claim 5, wherein the conductive material is at least any one selected from the group consisting of a Si-compound, a Ge (germanium)-compound material, Al, Cu, Au, Pt, Cr, Ru, and Ta.

7. The method as claimed in claim 1, wherein the first layer is an insulation layer, and the second layer is a conductive layer.

8. The method as claimed in claim 1, wherein the first layer is deposited by plasma enhanced chemical vapor deposition (PECVD).

9. The method as claimed in claim 1, wherein the first and second atoms migrate by means of heat treatment based on a process time and a process temperature.

10. The method as claimed in claim 1, wherein the first layer is deposited on a whole area of the substrate, and the second atoms are uniformly arranged in the first layer.

11. The method as claimed in claim 1, wherein the first layer has a window portion exposing a surface of the substrate, through which the second atoms migrate into the first layer to arrange the second atoms in the first layer.

12. A method of forming a quantum dot, comprising:
  i) depositing a SiON (silicon oxynitride) layer including Si atoms on a substrate, the Si atoms being superabundantly present therein and bound with a weak bonding energy in the SiON layer;
  ii) depositing a conductive layer including a conductive material on the SiON layer, the conductive material having reaction atoms capable of migrating into the SiON layer; and
  iii) performing a heat treatment to allow the reaction atoms to migrate from the conductive layer into the SiON layer, whereby the reaction atoms are arranged in the SiON layer to form a quantum dot.

13. The method as claimed in claim 12, wherein the SiON layer is deposited by means of plasma enhanced chemical vapor deposition using a $NH_3$ gas, a $N_2O$ gas, and a $SiH_4$ gas.

14. The method as claimed in claim 13, wherein a flow rate ratio of the $NH_3$ gas, the $N_2O$ gas and the $SiH_4$ gas is about 1:0.1 to 3.3:0.1 to 1.3, and a power for generating plasma is supplied at about 90 to 110 watts.

15. The method as claimed in claim 12, wherein the reaction atoms are Al, Cu, Au, Pt, Cr, Ru, or Ta, and the conductive material is at least any one selected from the group consisting of a Si compound, a Ge compound, Al, Cu, Au, Pt, Cr, Ru, and Ta.

16. A method of forming a gate electrode in a semiconductor device, comprising:
  i) defining a substrate into an active area and a field area;
  ii) depositing a gate oxide layer on the active area of the substrate;
  iii) depositing a SiON layer including Si atoms on the gate oxide layer, the Si atoms being superabundantly present therein and bound with weak bonding energy in the SiON layer;
  iv) depositing a conductive layer including a conductive material on the SiON layer, the conductive material having reaction atoms capable of migrating into the SiON layer;
  v) performing a heat treatment to allow the reaction atoms to migrate from the conductive layer to the SiON layer, so that the reaction atoms are arranged in the SiON layer to form the reaction atoms into a quantum dot;
  vi) removing the conductive layer to expose a surface of the SiON layer;
  vii) depositing an electrode layer including a gate electrode material on the SiON layer; and
  viii) sequentially etching the electrode layer and the SiON layer of a predetermined region to expose a surface of the gate oxide layer.

17. The method as claimed in claim 16, further comprising, after the conductive layer is deposited:
  depositing an anti-agglomerative layer on the conductive layer to prevent the conductive layer from being cohered in performing the heat treatment; and removing the anti-agglomerative layer after performing the heat treatment.

18. The method as claimed in claim 16, wherein a diameter of the quantum dot is about no more than 70 nm.

19. A method of forming a gate electrode in a semiconductor device, comprising:
  i) defining a substrate into an active area and a field area;
  ii) depositing a gate oxide layer on the active area of the substrate;
  iii) depositing a SiON layer including Si atoms on the gate oxide layer, the Si atoms being superabundantly present therein and bound with weak bonding energy in the SiON layer;
  iv) etching the SiON layer of a predetermined region to form a SiON pattern layer for partially exposing a surface of the gate oxide layer;
  v) successively depositing a conductive layer including a conductive material on the SiON pattern layer and the gate oxide layer, the conductive material having reaction atoms capable of migrating into the SiON layer;
  vi) performing a heat treatment to allow the reactant atoms to migrate from the conductive layer to the SiON layer, so that the reaction atoms are arranged in the SiON layer to form the reaction atoms into a quantum dot;
  vii) removing the conductive layer to expose a surface of the SiON pattern layer and the gate oxide layer; and
  viii) depositing an electrode layer including a gate electrode material on the SiON pattern layer.

20. The method as claimed in claim 19, further comprising, after the conductive layer is deposited:
  depositing an anti-agglomerative layer on the conductive layer to prevent the conductive layer from being cohered in performing the heat treatment; and
  removing the anti-agglomerative layer after performing the heat treatment.

21. The method as claimed in claim 19, wherein a diameter of the quantum dot is about no more than 70 nm.

22. A method for forming a gate electrode in a semiconductor device, comprising:
  i) defining a substrate into an active area and a field area;
  ii) depositing a gate oxide layer on the active area of the substrate;
  iii) depositing a SiON layer including Si atoms on the gate oxide layer, the Si atoms being superabundantly present therein and bound with weak bonding energy in the SiON layer;

iv) depositing a conductive layer including a conductive material on the SiON layer, the conductive material having reaction atoms capable of migrating into the SiON layer;

v) performing a heat treatment to allow the reaction atoms to migrate from the conductive layer to the SiON layer, whereby the reaction atoms are arranged in the SiON layer to form the reaction atoms into a quantum dot; and vi) sequentially etching the conductive layer and the SiON layer of a predetermined region to expose a surface of the gate oxide layer.

23. The method as claimed in claim 22, wherein the conductive material is at least any one selected from the group consisting of W, Al, Cu, Au, Pt, Cr, Ru, and Ta.

* * * * *